United States Patent
Zhou et al.

(10) Patent No.: US 8,686,746 B2
(45) Date of Patent: Apr. 1, 2014

(54) TEST APPARATUS AND METHOD FOR MEASURING COMMON-MODE CAPACITANCE

(75) Inventors: Min Zhou, Shanghai (CN); Yicong Xie, Shanghai (CN); Jinping Zhou, Shanghai (CN); Jianping Ying, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 663 days.

(21) Appl. No.: 12/827,115

(22) Filed: Jun. 30, 2010

(65) Prior Publication Data

US 2011/0001495 A1 Jan. 6, 2011

Related U.S. Application Data

(60) Provisional application No. 61/222,191, filed on Jul. 1, 2009.

(51) Int. Cl.
*G01R 27/26* (2006.01)

(52) U.S. Cl.
USPC .................. 324/686; 363/16; 363/17; 363/53; 324/605

(58) Field of Classification Search
USPC ......................................................... 324/686
See application file for complete search history.

(56) References Cited

U.S. PATENT DOCUMENTS

| | | | | |
|---|---|---|---|---|
| 4,785,233 A | * | 11/1988 | Coleman | 324/605 |
| 5,898,581 A | * | 4/1999 | Liu | 363/53 |
| 2005/0083714 A1 | * | 4/2005 | Zhu et al. | 363/17 |
| 2006/0242504 A1 | * | 10/2006 | Kadota | 714/725 |
| 2007/0091648 A1 | * | 4/2007 | Johnston | 363/16 |
| 2007/0158663 A1 | * | 7/2007 | Holcombe et al. | 257/82 |
| 2007/0171585 A1 | * | 7/2007 | Sicong et al. | 361/38 |
| 2008/0265917 A1 | * | 10/2008 | Schwarz et al. | 324/725 |
| 2009/0125279 A1 | * | 5/2009 | Fakterman | 702/189 |

OTHER PUBLICATIONS

Xinkui et al. "More Precise Model for Parasitic Capacitances in High Frequency Transformer", 2002, 33$^{rd}$ IEEE Power Electronics Specialists Conference, vol. 2, pp. 1054-1057, copyright 2002 IEEE.*

* cited by examiner

*Primary Examiner* — Benjamin M Baldridge
(74) *Attorney, Agent, or Firm* — Evan R. Witt; Kirton McConkie

(57) ABSTRACT

Disclosed is a test apparatus for measuring the common-mode parasitic capacitance between a first element and a second element being isolated from the first element. The test apparatus includes a signal generating device connected to the first element and having an internal signal source connected in series with a first internal impedance for sending a signal to the first element, and a signal receiving device connected between the second element and the first element and having a second internal impedance for measuring a signal response between the first element and the second element, thereby calculating the common-mode capacitance between the first element and the second element based on the signal response.

20 Claims, 10 Drawing Sheets

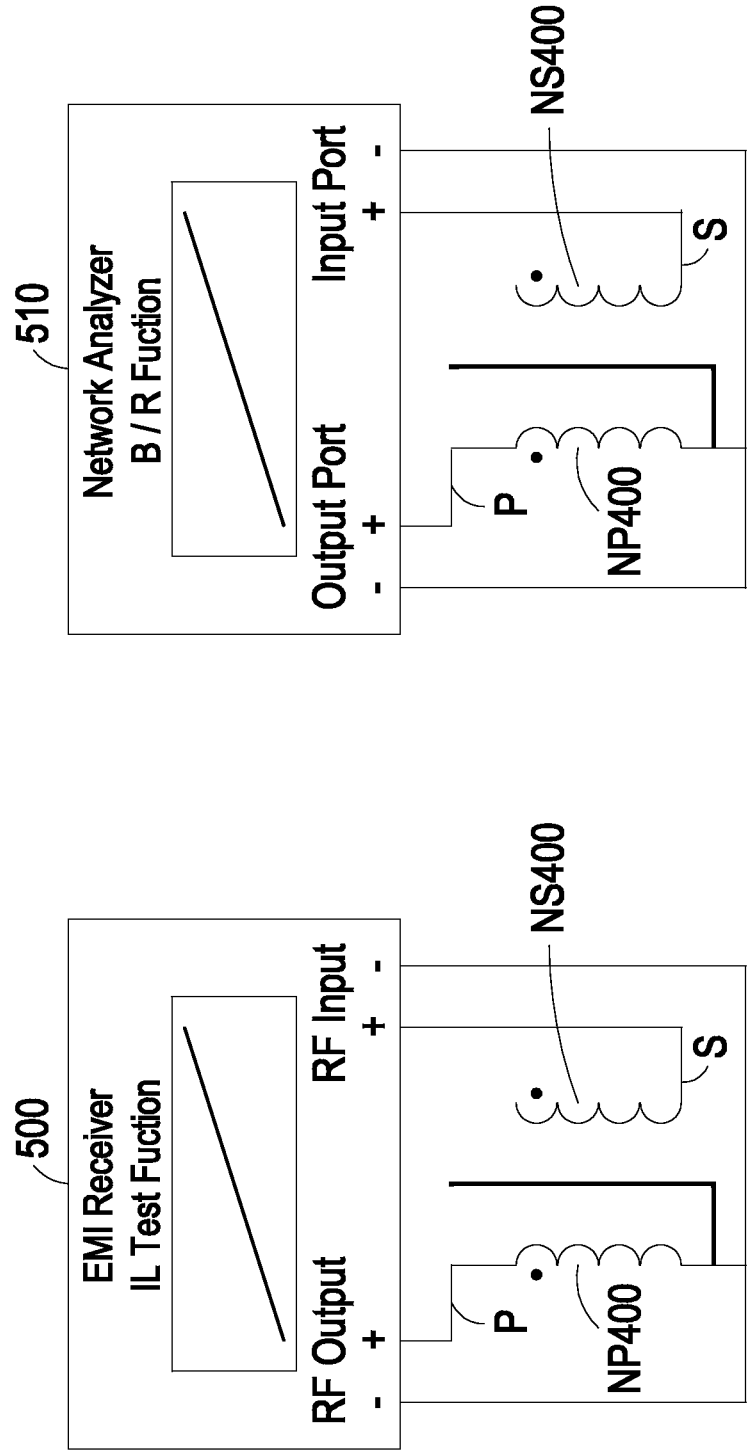

US 8,686,746 B2

TEST APPARATUS AND METHOD FOR MEASURING COMMON-MODE CAPACITANCE

CROSS-REFERENCE TO RELATED APPLICATION

This application claims the benefit of U.S. Provisional Application No. 61/222,191, filed on Jul. 1, 2009, and entitled "PARASITIC PARAMETER MEASUREMENT WITH DISPLACEMENT CURRENT", the entirety of which is hereby incorporated by reference.

FIELD OF THE INVENTION

The present invention is related to a switching mode power supply, and more particularly to a test apparatus and method for measuring the common-mode parasitic capacitance existing between two isolated elements in a switching mode power supply.

BACKGROUND OF THE INVENTION

Nowadays, electric and electronic equipment which are intended to be marketed must meet some standards on electromagnetic interference (EMI) that are promulgated by FCC or CISPR. Usually EMI can be classified into differential-mode (DM) noise and common-mode (CM) noise. The differential-mode current flows between the Line and the Neutral, and the DM noise level is determined by the ripple current of input terminal of the power supply. The common-mode current flows between the power line and earth ground, and CM noise is caused by charging and discharging the parasitic capacitance between hot-voltage points, where the voltage jumps rapidly in the circuit within the EMI test frequency range, and earth ground.

Usually, the common-mode current is not determined by only one capacitance. FIG. 1 shows a power supply with a flyback converter topology. The flyback converter 100 of FIG. 1 includes a bridge rectifier 110, a filtering capacitor 112 connected in parallel with the bridge rectifier 110, a transformer T100 having a primary winding N100 and a secondary winding S100, a switch 114 connected to the primary winding N100, a rectifier diode 116 connected to the secondary winding S100, and an output capacitor 118. The flyback converter 100 is configured to power a load 120. Also, a standard Line Impedance Stabilizing Network (LISN) 130 is provided and connected to the input terminal of the flyback converter 100 and is configured to provide the constant impedance for the converter to measure the EMI noise, and also to provide isolation for the equipment under test (EUT) from the ambient noise on the power lines. The ON/OFF operations of the switch 114 produce high dv/dt on the point P in the circuit, and the point P is a hot-voltage point. Point B and point S have the same polarity. The common-mode current 3 goes to earth ground via a primary side capacitance $C_P$, a transformer parasitic capacitance $C_{PS}$ and a secondary side capacitance $C_{S\_G}$, wherein $C_P$ and $C_{S\_G}$ are the capacitance between the power supply and earth-ground. As shown in FIG. 1, the equivalent common-mode capacitance of the power supply is the result of the secondary side capacitance $C_{S\_G}$ in series with the transformer parasitic capacitance $C_{PS}$, and then in parallel with the primary side capacitance Cp. There have been numerous techniques to reduce the primary side capacitance $C_P$, and the capacitance of the secondary side capacitance $C_{S\_G}$ in series with the transformer parasitic capacitance $C_{PS}$ is determined by the transformer parasitic capacitance $C_{PS}$ since the secondary side capacitance $C_{S\_G}$ is much larger than the transformer parasitic capacitance $C_{PS}$. Therefore, the equivalent common-mode capacitance is finally dominated by the value of the transformer parasitic capacitance $C_{PS}$. The earlier we know the capacitance of the transformer parasitic capacitance $C_{PS}$, the better in designing the EMI filter circuit. Hence, if we can obtain an accurate value of $C_{PS}$, the quality control in mass production will be improved.

Usually there are two methods to get parasitic capacitance $C_{PS}$, one is calculation, and the other is test. It is known that models can be built based on the transformer structure, and the parasitic capacitance between the primary and secondary side of the transformer can be calculated in static electric field. But the results deviate from the fact, because when the switching mode power supply is operating, the voltage along the winding varies, thus the voltage of each turn of the transformer winding are different. However, the calculation in the static electric field doesn't consider about it. So there is no simple method to calculate this equivalent common-mode capacitance accurately in engineering application.

FIG. 2A and FIG. 2B show the conventional test apparatus for calculating the common-mode capacitance, in which FIG. 2A shows the internal configuration of the test apparatus and FIG. 2B shows the testing configuration of the test apparatus with the transformer. The test apparatus 7 is typically an impedance analyzer or LCR meter. The calculation carried out by the conventional test apparatus 7 is incorrect because either impedance analyzer or LCR meter is one-port network with only two terminals 8 and 9. The inner voltage source 10 of the test apparatus 7 is connected to the equipment under test 11 via terminal 8 and 9. After the current response 12 and voltage response 13 are obtained, the impedance characteristic of equipment under test 11 can be calculated. It is obvious that in the one-port network 7, the voltage source 10 and the responses 12, 13 are obtained from the same terminal 8 and 9. In FIG. 2B, LCR meter or impedance analyzer can measure the parasitic capacitance 14 between the primary side winding 15 and the secondary side winding 16 accurately. But the common-mode current between the primary side and the secondary side is the displacement current which is related with the voltage drop between the primary and secondary winding, as shown in FIG. 3. FIG. 3A shows the transformer structure without shielding and FIG. 3B shows the transformer structure with shielding. Suppose the turns of the primary winding 15 are larger than that of the secondary winding 16, and the bottom turn 17 is usually connected to point B in FIG. 1, where the voltage is almost stable in EMI test frequency range, and we denote it as a quiet point. The top turn 18 is usually connected to hot-voltage point P in FIG. 1, where the voltage jumps rapidly. And turn 18, 20 have the same polarity. It is obvious that the voltage difference between turn 17 and 19 is almost zero, thus there is almost no common-mode displacement current. The voltage difference between turn 18 and 20 is the largest, thus there is the largest common-mode displacement current between them. The capacitance 14 in FIG. 2B can not disclose such phenomena, so it is not the capacitance we wanted. In other words, the test method as shown in FIG. 2 doesn't consider the voltage variations along the windings 15 or 16 from the top winding portion e.g. turn 18 or 20 toward the bottom winding portion e.g. turn 17 or 19. And since there is no voltage difference between the windings 17 and 19, there is no voltage difference between windings 15 and 16. If there is no voltage difference between the winding 15 and the winding 16, the displacement current is zero although capacitance 14 exists, so capacitance 14 has no contribution to common-mode current. Obviously the capacitance 14 is not the key common-mode capacitance $C_{PS}$ mentioned above. If there is a shielding layer 21 between the primary side winding 15 and the secondary side winding 16 in the transformer, one-port network can only measure the parasitic capacitance 22 between shielding layer 21 and secondary side winding 16. This capacitance 22 can not represent the equivalent CM capacitance $C_{PS}$ either.

Based on the foregoing descriptions, it is intended by the applicant of the invention to disclose a test apparatus of measuring equivalent parameters. The proposed test apparatus doesn't depend on completed product test, and can get the accurate parasitic parameters in the early design cycle, thereby helping in designing EMI filter in a switching mode power supply. It can be also used to control the transformer quality during the mass production, reduce the control cost effectively. Therefore, it is an imminent tendency to develop a test apparatus and method applied to the power converter such that the aforesaid deficiencies and disadvantages can be addressed.

SUMMARY OF THE INVENTION

An object of the invention is to provide a test apparatus for accurately measuring the common-mode parasitic capacitance between a first element and a second element being isolated with each other.

The invention proposes a test apparatus for measuring common-mode parasitic capacitance existed between a first element and a second element being isolated from the first element. The test apparatus includes a signal generating device connected to the first electronic element and having an internal signal source connected in series with a first internal impedance for sending a signal to the first element, and a signal receiving device connected between the second element and the first element and having a second internal impedance for measuring a signal response between the first element and the second element, thereby calculating the common-mode parasitic capacitance existed between the first element and the second element based on the signal response.

The invention also proposes a test method for measuring common-mode parasitic capacitance existed between a first element and a second element being isolated from the first element. The test method comprises steps of: providing a signal generating device and a signal receiving device, wherein the signal generating device is connected to the first element and has an internal signal source connected in series with a first internal impedance; and the signal receiving device is connected between the second element and the first element and has a second internal impedance; providing a signal from the internal signal source of the signal generating device to the first element; and measuring a signal response between the first element and the second element by the signal receiving device and calculating the common-mode parasitic capacitance existed between the first element and the second element based on the signal response.

Now the foregoing and other features and advantages of the present invention will be best understood through the following descriptions with reference to the accompanying drawings, wherein:

BRIEF DESCRIPTION OF THE DRAWINGS

FIG. 5A shows an example of the test apparatus of the invention, wherein the signal generating device and the signal receiving device are implemented in an EMI receiver;

FIG. 5B shows another example of the test apparatus of the invention, wherein the signal generating device and the signal receiving device are implemented in a network analyzer;

DESCRIPTION OF THE PREFERRED EMBODIMENT

Several preferred embodiments embodying the features and advantages of the present invention will be expounded in following paragraphs of descriptions. It is to be realized that the present invention is allowed to have various modification in different respects, all of which are without departing from the scope of the present invention, and the description herein and the drawings are to be taken as illustrative in nature, but not to be taken as limitative.

Figure 1:
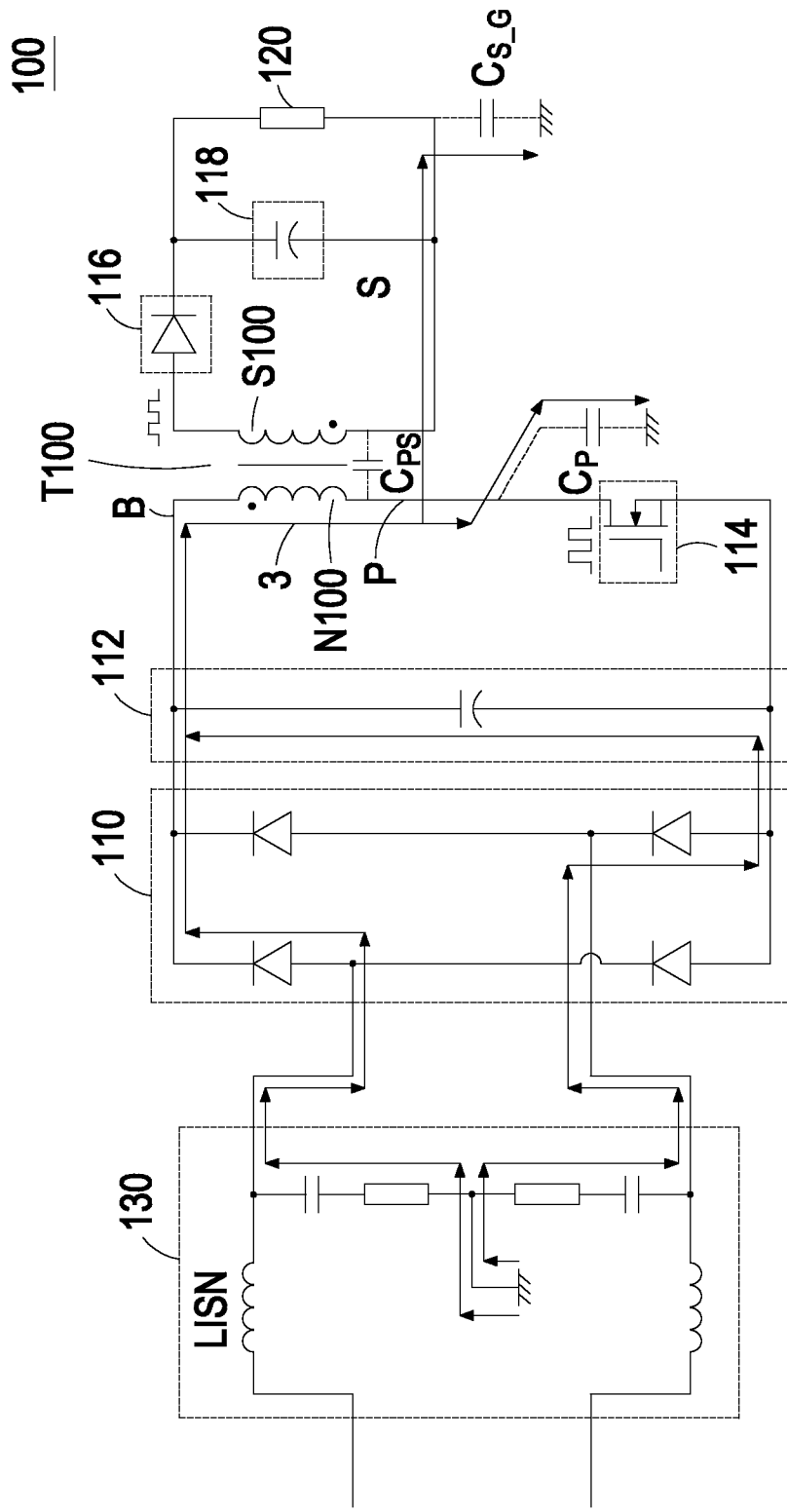
FIG. 1 shows a power supply with flyback converter topology.
Figures 2A, 2B:
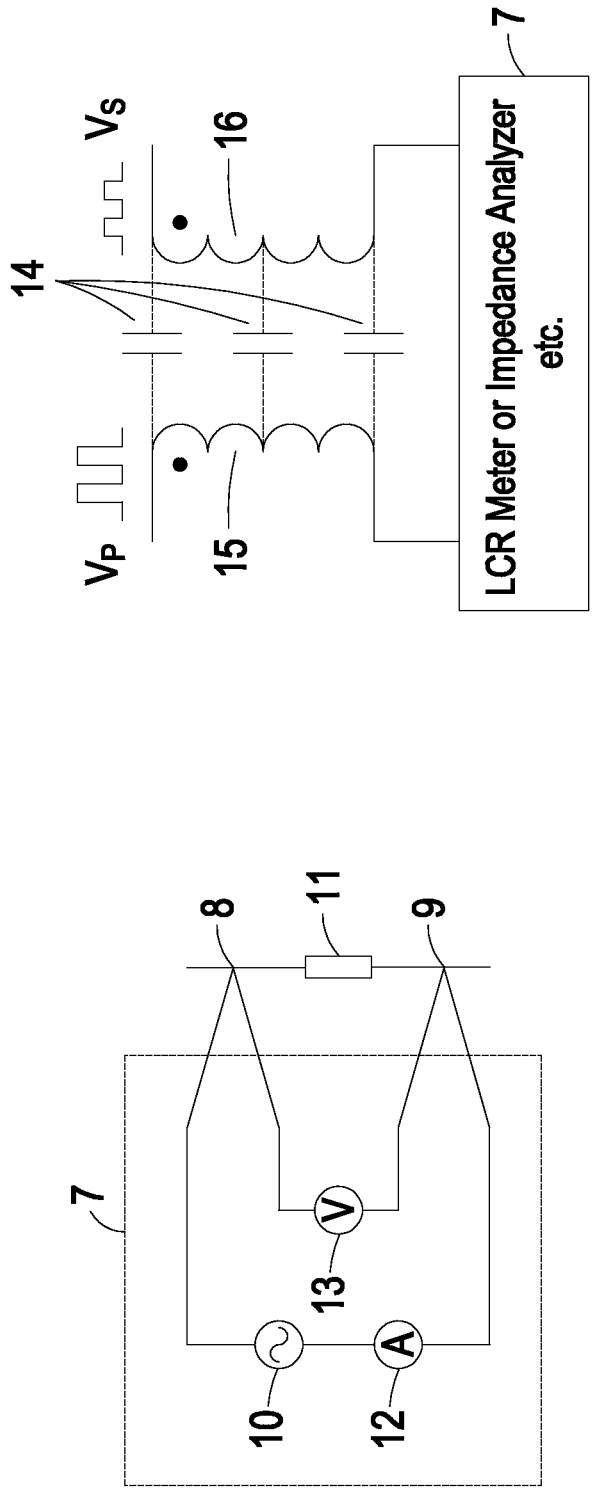
FIG. 2A shows the internal configuration of the test apparatus according to the prior art.
FIG. 2B shows the testing configuration of the test apparatus along with the transformer according to the prior art.
Figure 3B:
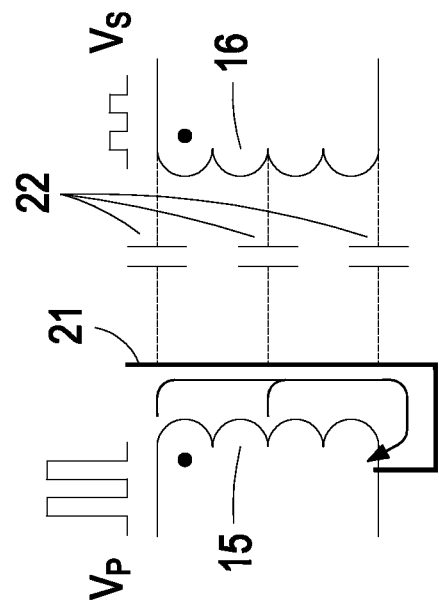
FIG. 3B shows the transformer structure with shielding.
Figure 3A:
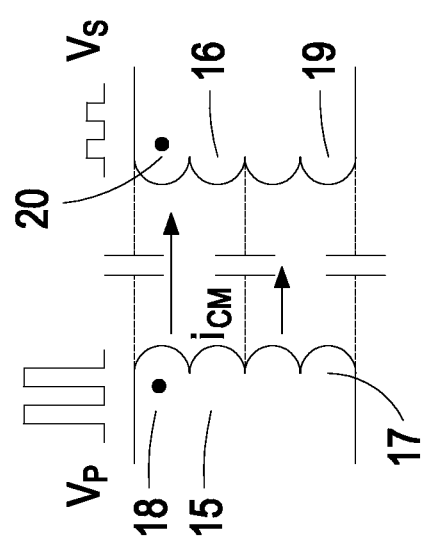
FIG. 3A shows the transformer structure without shielding.
Figure 4A:
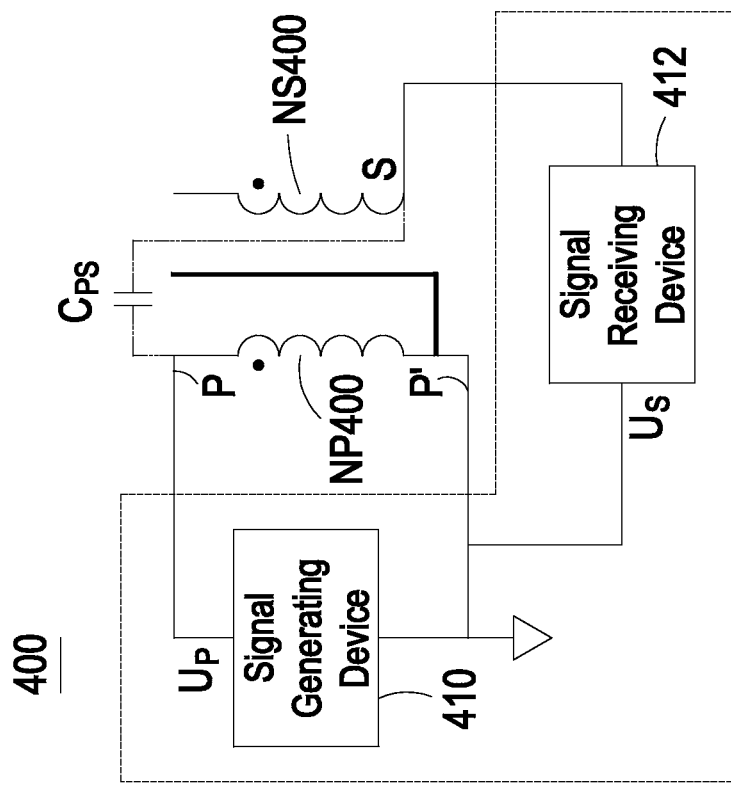
FIG. 4A shows an example of the inventive equivalent common-mode parasitic capacitance test apparatus between the primary side hot-voltage point P and secondary side quiet point S.
Figure 4B:
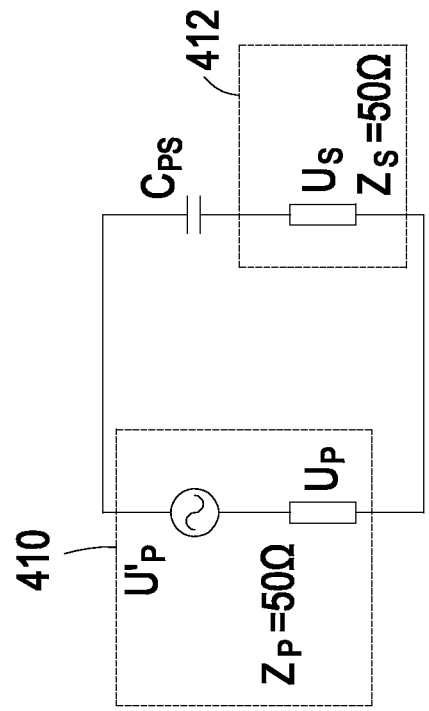
FIG. 4B is the equivalent circuit of the test apparatus of FIG. 4A.

In this invention, a test apparatus for the equivalent CM capacitance with the mechanism of a two-port network is disclosed. As shown in FIGS. 4A~4B, a test apparatus 400 includes a signal generating device 410 and a signal receiving device 412. FIG. 4A shows an example of the inventive equivalent common-mode parasitic capacitance test apparatus between the primary side hot-voltage point P and secondary side quiet point S. The signal generating device 410 is connected to the transformer primary winding NP400 on the points P and P'. The signal receiving device 412 is connected between primary side winding NP400 and secondary side winding NS400 on the point P' and S. For the signal receiving device 412, a spectrum analyzer can be used instead. The measurement mechanism is simulating the real running state of a transformer in a switching-mode power supply. It means the signal source is injected to the primary side winding NP400, and the response is got by measuring between the primary side and secondary side by the signal receiving device 412. The source and the response are in the different port, not the same as in one-port network measurement, where the source and the response are in the same port. So it can measure the equivalent common-mode parasitic capacitance $C_{PS}$ accurately.

FIG. 4B is the equivalent circuit of the test apparatus of FIG. 4A. As shown in FIG. 4A, usually the internal impedance $Z_P$ of the signal generating device 410 and the internal impedance $Z_S$ of the signal receiving device 412 are both 50Ω, so the output voltage $U_P$ of the signal generating device 410 refers to the voltage on the internal impedance $Z_P$, but not the real amplitude of the inner signal source $U'_P$. Usually $U'_P = 2U_P$, or $U'_P|_{dB} = U_P|_{dB} + 6$ with dB unit. Based on Ohm's Law, $C_{PS}$ can be calculated as follow:

$$U_S = U'_P \times \frac{50}{50 + 50 + Z_{PS}} \qquad (1)$$

$$\frac{U'_P}{U_S} = \frac{100 + Z_{PS}}{50} = 10^{\frac{U'_P|_{dB} - U_S|_{dB}}{20}}$$

$$Z_{PS} = 50 \times 10^{\frac{U'_P|_{dB} - U_S|_{dB}}{20}} - 100$$

$$|Z_{PS}| = \frac{1}{2\pi f C_{PS}} \gg$$

$$(50 + 50) \Rightarrow C_{PS} \approx \frac{1}{2\pi f \left(50 \times 10^{\frac{(U_P|_{dB}+6) - U_S|_{dB}}{20}} - 100\right)}$$

where $U_S$ is the output voltage of the signal generating device 412, and f is the measurement frequency, preferably the EMI test frequency.

FIG. 5A shows an example of the test apparatus of the invention, wherein the signal generating device 410 and the signal receiving device 412 are implemented in an EMI receiver 500. The EMI receiver 500 is widely used in EMI test, and the EMI receiver 500 with signal output module can be used to measure $C_{PS}$ with its Insertion Loss (IL) test function, as shown in FIG. 5A. If the test results is denoted as IL, and then formula (1) is changed as (2):

$$C_{PS} \approx \frac{1}{2\pi f \left(100 \times 10^{\frac{-IL}{20}} - 100\right)} \qquad (2)$$

Besides, FIG. 5B shows another example of the test apparatus of the invention, wherein the signal generating device 410 and the signal receiving device 412 are implemented in a network analyzer 510. The network analyzer 510 which is used to measure the transfer function can also be used to measure $C_{PS}$ with its calculation function of input/output, as shown in FIG. 5B. If the test result is denoted as I/O, the formula (1) is changed as (3):

$$C_{PS} \approx \frac{1}{2\pi f \left(100 \times 10^{\frac{-I/O}{20}} - 100\right)} \qquad (3)$$

Any apparatus with signal generating and signal receiving function can be used in the invention. The internal impedance $Z_P$ and $Z_S$ can be 50Ω or other values, and preferably the internal impedance $Z_P$ and $Z_S$ is much smaller than the impedance of $C_{PS}$ to get more accurate results. If the internal impedance of the signal generating device is $Z_A$, and the internal impedance of the signal receiving device is $Z_B$, the output voltage of signal generating device is $U_A$, the output voltage of the signal receiving device voltage is $U_B$, $C_{PS}$ can be calculated as:

$$C_{PS} \approx \frac{1}{2\pi f \left[\frac{Z_A + Z_B}{10^{\frac{U_B|_{dB} - U_A|_{dB}}{20}}} - (Z_A + Z_B)\right]} \qquad (4)$$

Figure 6B:
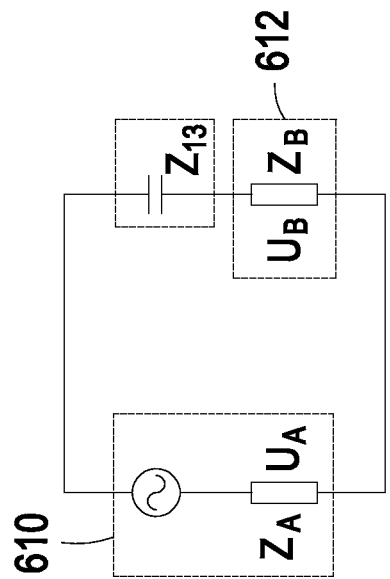
FIG. 6B is the equivalent circuit of the test apparatus of FIG. 6A.
Figure 6A:
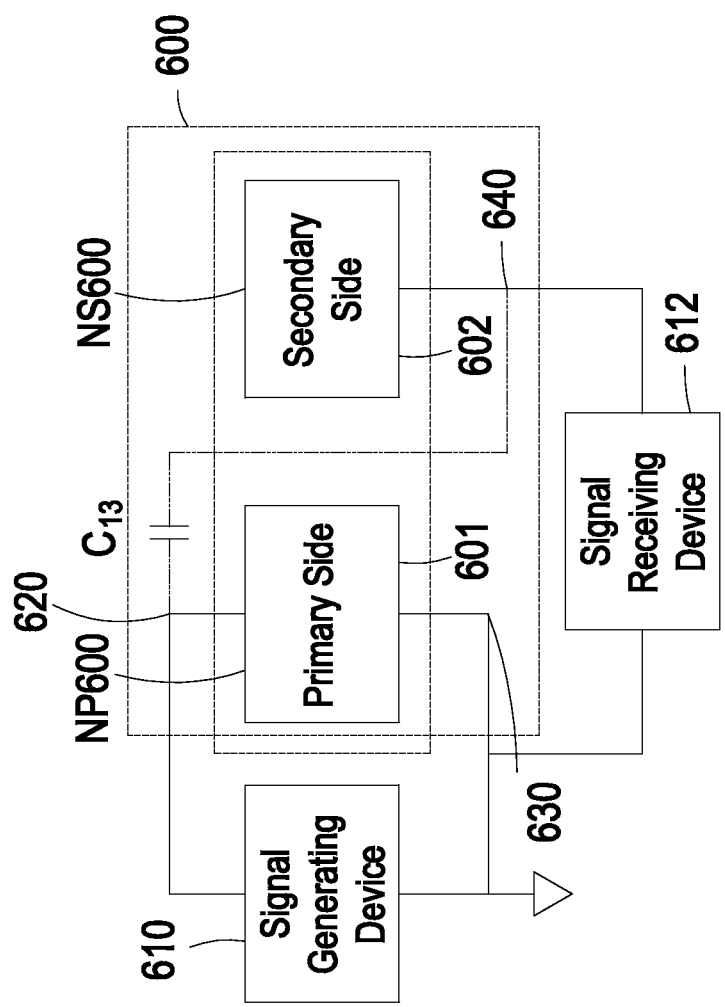
FIG. 6A shows a block diagram of the generalized test apparatus.

Above formulas are based on the test results in frequency domain. In fact, the test apparatus mentioned in this invention can also do with the device in time domain. FIG. 6A shows a block diagram of the generalized test apparatus. Equipment under test 600 includes a first element 601 and a second element 602 being isolated from the first element 601. There are at least two terminals or points 620, 630 in the first element 601, and there is at least one terminal or point 640 in the second element 602. The signal generating device 610 is connected to the first element 601 on terminals 620 and 630, and the signal receiving device 612 is connected between the first element 601 and the second element 602 on terminals 630 and 640. For example, the equipment under test 600 includes a transformer, the first element 601 includes the transformer primary winding NP600, and the second element 602 includes the transformer secondary winding NS600. The point 620 is a hot-voltage point of the transformer primary winding NP600 and the point 630 is a quiet point of the transformer primary winding NP600, and the point 640 is a quiet point of the transformer secondary winding NS600. FIG. 6B is the equivalent circuit of the test apparatus of FIG. 6A. Likewise, the internal impedance of the signal generating device 610 is $Z_A$ (i.e. first internal impedance), and the internal impedance of the signal receiving device 612 is $Z_B$ (i.e. second internal impedance), the output voltage of signal generating device 610 is $U_A$, the output voltage of the signal receiving device 612 is $U_B$. In an embodiment, the signal generating device 610 has an internal signal source connected in series with the internal impedance $Z_A$ (i.e. first internal impedance) for sending a signal to the first element 601, and the signal receiving device 612 has a second internal impedance $Z_B$ (i.e. second internal impedance) for measuring a signal response between the first element 601 and the second element 602, thereby calculating the common-mode parasitic capacitance existed between the first element 601 and the second element 602 based on the signal response. In accordance with the concept of the present invention, the impedance between points 620 and 640 can be calculated with Ohm's Law:

$$Z_{13} = \left(\frac{U_A}{U_B} - 1\right)(Z_A + Z_B) \qquad (5)$$

The equivalent parasitic CM capacitance can be calculated as:

$$C_{13} \approx \frac{1}{2\pi f |Z_{13}|} \quad (6)$$

Figure 7:
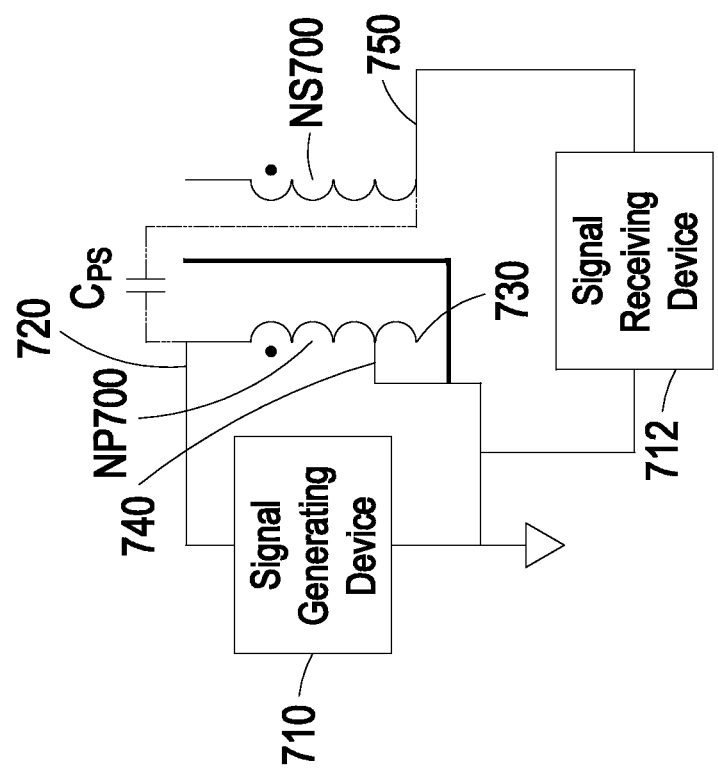
FIG. 7 shows a modified version of the inventive equivalent common-mode parasitic capacitance test apparatus of FIG. 4A.

FIG. 7 shows another connection method for testing the CM capacitance of a transformer as shown in FIGS. 4A, 4B, 5A, 5B 6A, and 6B, wherein the signal generating device connects in parallel with the partial primary winding of the transformer. As shown in FIG. 7, the signal generating device 710 is connected to a hot-voltage point 720 and a voltage point 740 between the hot-voltage point 720 and a quiet point 730 of a transformer primary winding NP700. The signal receiving device 712 is connected between the voltage point 740 and a quiet point 750 of the transformer secondary winding NS700. Certainly, the signal generating device 710 can also be connected to the voltage point 740 and a quiet point 730 of the transformer primary winding NP700. The signal receiving device 712 is connected between the quiet point 730 of the transformer primary winding NP700 and the quiet point 750 of the transformer secondary winding NS700.

Figure 8B:
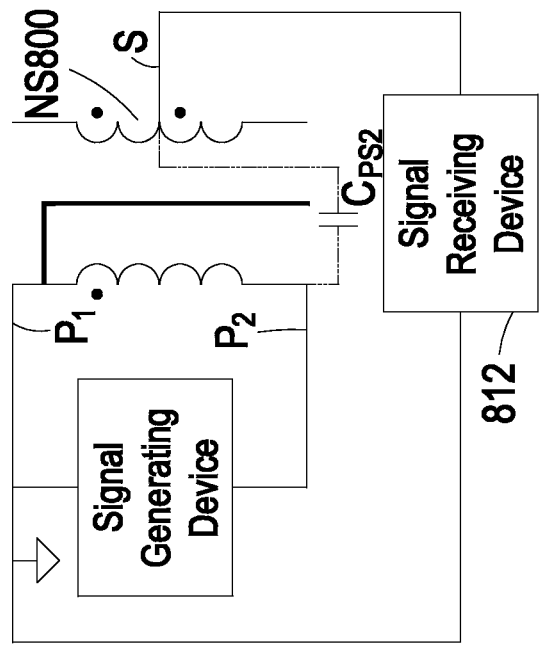
FIG. 8B shows the topology of the inventive test apparatus being applied to a transformer in a phase-shift full-bridge converter, in which the common-mode parasitic capacitance is measured based on the signal response between a second hot-voltage point of the primary winding and a quiet point of the secondary winding.
Figure 8A:
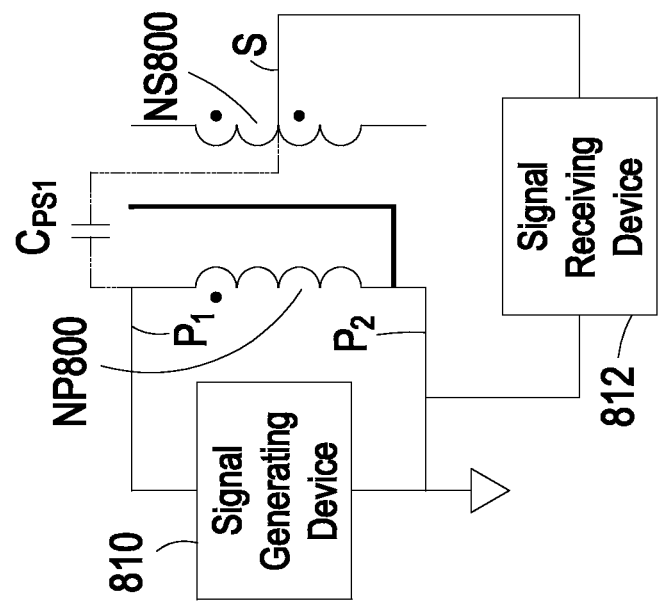
FIG. 8A shows the topology of the inventive test apparatus being applied to a transformer in a phase-shift full-bridge converter, in which the common-mode parasitic capacitance is measured based on the signal response between a first hot-voltage point of the primary winding and a quiet point of the secondary winding.

The test apparatus of the invention can not only measure the transformer's equivalent common-mode parasitic capacitance in a flyback converter, but also measure the transformers in any other topology converters. Take the transformer in phase-shift full-bridge for example, the two terminals of primary side winding $P_1$, $P_2$ both are hot-voltage points, and we can measure them respectively, as shown in FIGS. 8A and 8B. FIGS. 8A and 8B shows the topology of the inventive test apparatus being applied to a transformer in a phase-shift full-bridge converter. As shown in FIG. 8A, two ends of the signal generating device 810 are connected to the first hot-voltage point P1 and the second hot-voltage point P2, respectively. The signal receiving device 812 is connected between the second hot-voltage point P2 and a quiet point S of the secondary winding NS800 which for example is a center-tap point, thereby the common-mode parasitic capacitance $C_{PS1}$ is measured based on the signal response between the hot-voltage point P1 of the primary winding NP800 and the center-tapped quiet point S of the secondary winding NS800. As shown in FIG. 8B, two ends of the signal generating device 810 are connected to the first hot-voltage point P1 and the second hot-voltage point P2, respectively. The signal receiving device 812 is connected between the first hot-voltage point P1 and a quiet point S of the secondary winding NS800 which for example is a center-tap point, thereby the common-mode parasitic capacitance $C_{PS2}$ is measured based on the signal response between a hot-voltage point $P_2$ of the primary winding NP800 and a center-tapped quiet point S of the secondary winding NS800.

Figures 9A, 9B:
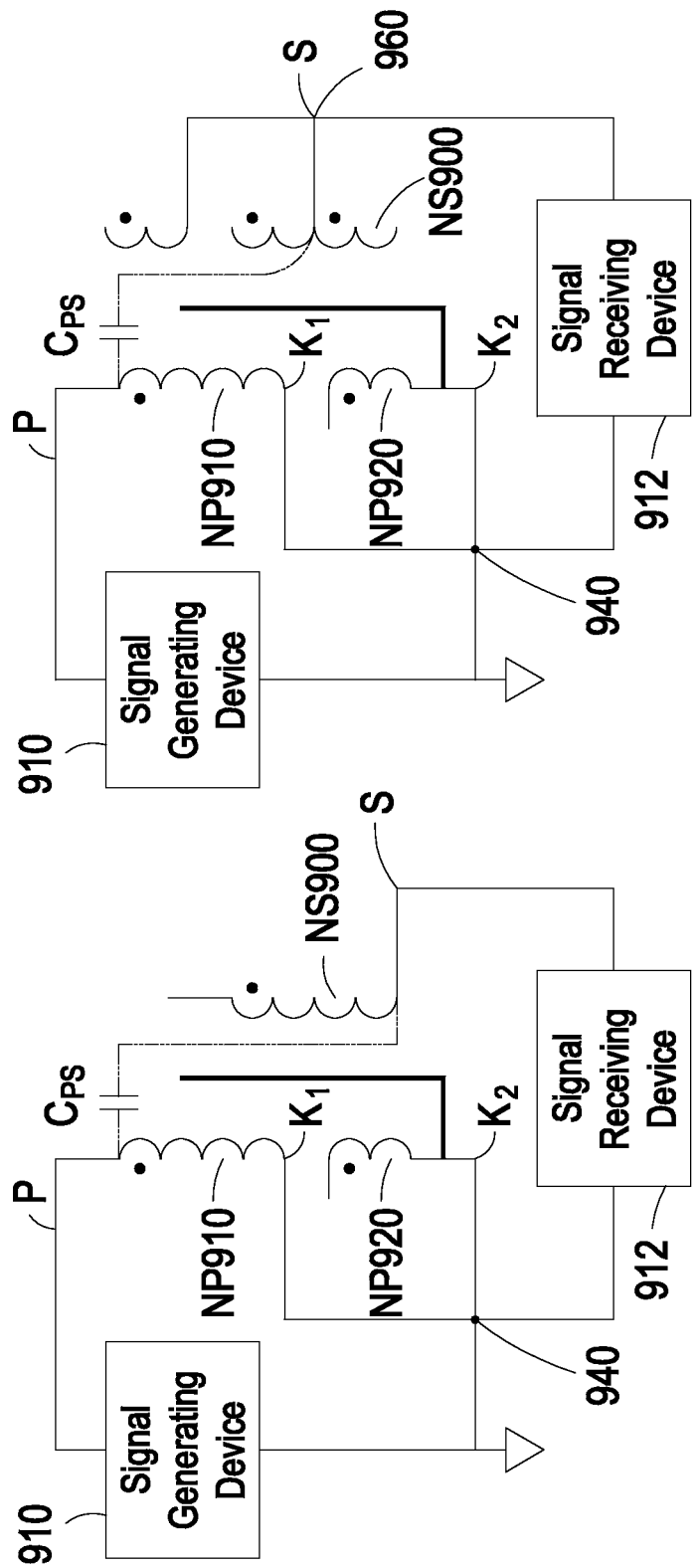
FIG. 9A is a circuit diagram showing the inventive test apparatus being applied to a transformer having a plurality of primary windings and a secondary winding.
FIG. 9B is a circuit diagram showing the inventive test apparatus being applied to a transformer having a plurality of primary windings and a plurality of secondary windings.

In some converters, the transformer has multiple windings, and we usually test the $C_{PS}$ based on the main winding. FIG. 9A is a circuit diagram showing the inventive test apparatus being applied to a transformer having a plurality of primary windings and a secondary winding. FIG. 9B is a circuit diagram showing the inventive test apparatus being applied to a transformer having a plurality of primary windings and a plurality of secondary windings. In FIG. 9A, the quiet points $K_1$, $K_2$ of the primary windings NP910, NP920 are connected to a common node 940, and the signal generating device 910 is connected between a hot-voltage point P of the main primary winding NP910 and the common node 940. The signal receiving device 912 is connected to a quiet point S of the secondary winding NS900 and the common node 940.

In FIG. 9B, the quiet points of the primary windings NP910, NP920 are connected to a first common mode 940, and the signal generating device 910 is connected between a hot-voltage point P of the main primary winding NP910 and the first common mode 940. The quiet points of the secondary windings NS900 are connected to a second common node 960, and the signal receiving device 912 is connected between the first common node 940 and the second common node 960. Test results between different terminals are not the same, because the voltages of different terminals are not the same. So it is necessary that the measurement is according to the real running state of the transformer in the switching mode power supply.

In the above embodiments, the equipment under test, for example a transformer, comprises a shielding layer connected to the first element and disposed between the first element and the second element for reducing a common-mode current between the first element and the second element. Certainly, in some embodiments, this test apparatus and test method are also suitable for the transformer without shielding layer.

Figure 10A:
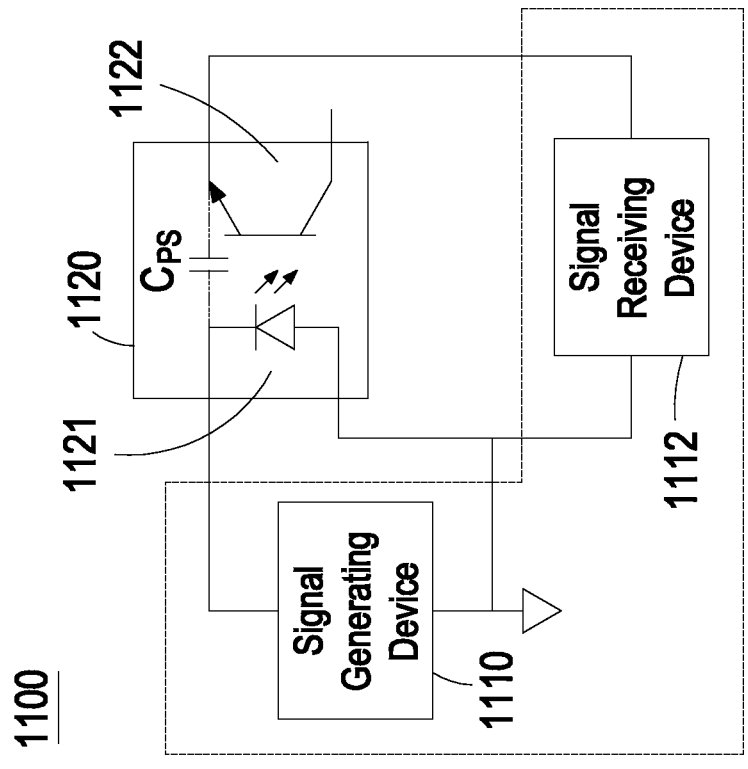
FIG. 10A is a circuit diagram showing the inventive test apparatus being applied to a MOSFET and its heat sink.
Figure 10B:
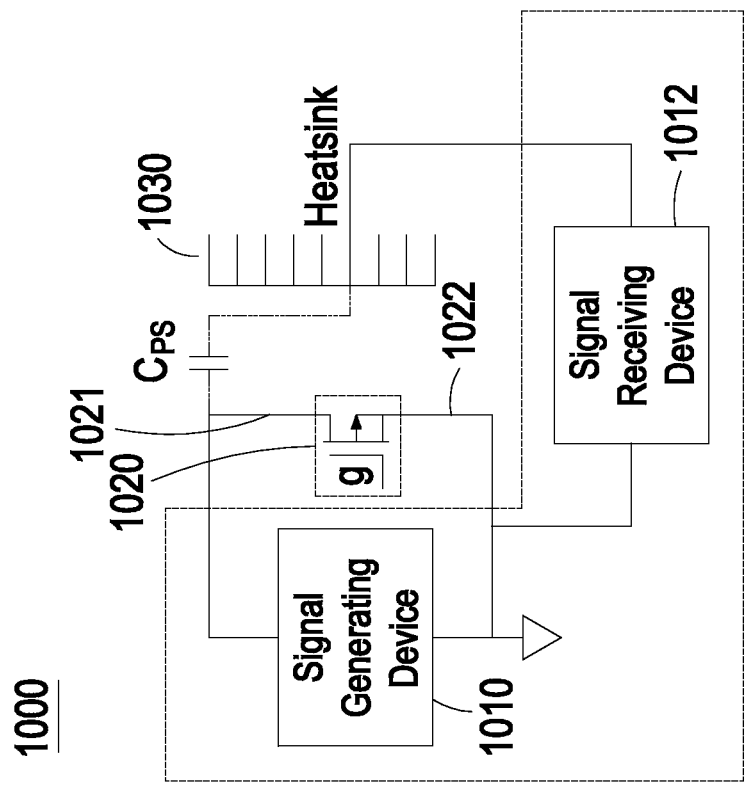
FIG. 10B is a circuit diagram showing the inventive test apparatus being applied to an optical coupler.

This test apparatus is suitable for measuring not only the parasitic parameters of transformer, but also the parasitic parameters of any other two points. For example, the parasitic parameters between one terminal of a switch e.g. drain terminal of MOSFET and its heatsink which is isolated from the MOSFET 1020, the parasitic parameters between primary side and secondary side of optical coupler, respectively, as shown in FIGS. 10A and 10 B. As shown in FIG. 10A, a test apparatus 1000 includes a signal generating device 1010 and a signal receiving device 1012. The signal generating device 1010 is connected to the drain terminal 1021 and the source terminal 1022 of MOSFET 1020. The signal receiving device 1012 is connected between source terminal 1022 of MOSFET 1020 and its heatsink 1030 which is isolated from the MOSFET 1020. The connection point of the signal receiving device 1012 and the heatsink 1030 can be e.g. a quiet point. The test apparatus 1000 is employed for measuring equivalent common-mode parasitic capacitance $C_{PS}$ between drain 1021 of MOSFET 1020 and its heatsink 1030. As shown in FIG. 10B, a test apparatus 1100 includes a signal generating device 1110 and a signal receiving device 1112. The signal generating device 1110 is connected to the two ends of the primary side 1121 of the optical coupler 1120. The signal receiving device 1112 is connected between one end of the primary side 1121 and one end of the secondary side 1122 of the optical coupler 1120. And the primary and secondary sides 1121, 1122 of the optical coupler 1120 are isolated. The end of the secondary side 1122 of the optical coupler 1120 can be e.g. a quiet point. The test apparatus 1100 is employed for measuring equivalent common-mode parasitic capacitance $C_{PS}$ between primary side 1121 and secondary side 1122 of optical coupler 1120.

To sum up, the present invention provides a test apparatus of measuring equivalent parameters with a two-port network. The test apparatus of the present invention doesn't depend on completed product test, and can get the accurate parasitic parameters in the early design cycle, thereby helping in designing EMI filter in a switching mode power supply. It can be also used to control the transformer quality during the mass production, reduce the control cost effectively. In addition, the test apparatus of the present invention is suitable for measuring not only the parasitic parameters of transformer, but also the parasitic parameters of any other two points, which can't be achieved by any prior arts.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A test apparatus used to measure common-mode capacitance between a first element and a second element being isolated from the first element, comprising:
   a signal generating device connected to the first element and having an internal signal source connected in series with a first internal impedance for sending a signal to the first element; and
   a signal receiving device directly connected between the second element and the first element and having a second internal impedance for measuring a signal response between the first element and the second element, thereby calculating the common-mode capacitance between the first element and the second element based on the signal response;
   wherein the first element includes a transformer primary winding and the second element includes a transformer secondary winding;
   wherein both the transformer primary winding and the transformer secondary winding are disposed in a phase-shift full-bridge converter;
   wherein the signal generating device is connected between a first hot-voltage point and a second hot-voltage point of the transformer primary winding and the signal receiving device is connected between a quiet point of the transformer secondary winding and the first hot-voltage point of the transformer primary winding.

2. The test apparatus used to measure common-mode capacitance according to claim 1 wherein the signal receiving device includes a spectrum analyzer.

3. The test apparatus used to measure common-mode capacitance according to claim 1 wherein the signal generating device and the signal receiving device are implemented in an EMI receiver or a network analyzer.

4. The test apparatus used to measure common-mode capacitance according to claim 1 further comprising a shielding layer connected to the first element and disposed between the first element and the second element for reducing a common-mode current between the first element and the second element.

5. The test apparatus used to measure common-mode capacitance according to claim 1 wherein both the transformer primary winding and the transformer secondary winding are disposed in a flyback converter.

6. A test apparatus used to measure common-mode capacitance between a first element and a second element being isolated from the first element, comprising:
   a signal generating device connected to the first element and having an internal signal source connected in series with a first internal impedance for sending a signal to the first element; and
   a signal receiving device directly connected between the second element and the first element and having a second internal impedance for measuring a signal response between the first element and the second element, thereby calculating the common-mode capacitance between the first element and the second element based on the signal response;
   wherein the first element includes a transformer primary winding and the second element includes a transformer secondary winding;
   wherein both the transformer primary winding and the transformer secondary winding are disposed in a phase-shift full-bridge converter;
   wherein the signal generating device is connected between a first hot-voltage point and a second hot-voltage point of the transformer primary winding and the signal receiving device is connected between a quiet point of the transformer secondary winding and the second hot-voltage point of the transformer primary winding.

7. The test apparatus used to measure common-mode capacitance according to claim 6 wherein the signal receiving device includes a spectrum analyzer.

8. The test apparatus used to measure common-mode capacitance according to claim 6 wherein the signal generating device and the signal receiving device are implemented in an EMI receiver or a network analyzer.

9. The test apparatus used to measure common-mode capacitance according to claim 6 further comprising a shielding layer connected to the first element and disposed between the first element and the second element for reducing a common-mode current between the first element and the second element.

10. The test apparatus used to measure common-mode capacitance according to claim 6 wherein both the transformer primary winding and the transformer secondary winding are disposed in a flyback converter.

11. A test apparatus used to measure common-mode capacitance between a first element and a second element being isolated from the first element, comprising:
    a signal generating device connected to the first element and having an internal signal source connected in series with a first internal impedance for sending a signal to the first element; and
    a signal receiving device directly connected between the second element and the first element and having a second internal impedance for measuring a signal response between the first element and the second element, thereby calculating the common-mode capacitance between the first element and the second element based on the signal response;
    wherein the first element includes a plurality of transformer primary windings and the second element includes a transformer secondary winding;
    wherein quiet points of the transformer primary windings are connected with each other to a common node, and wherein the signal generating device is connected between a hot-voltage point of a main winding of the transformer primary windings and the common node of the transformer primary windings and the signal receiving device is connected between a quiet point of the transformer secondary winding and the common node of the transformer primary windings.

12. The test apparatus used to measure common-mode capacitance according to claim 11 wherein the signal receiving device includes a spectrum analyzer.

13. The test apparatus used to measure common-mode capacitance according to claim 11 wherein the signal generating device and the signal receiving device are implemented in an EMI receiver or a network analyzer.

14. The test apparatus used to measure common-mode capacitance according to claim 11 further comprising a shielding layer connected to the first element and disposed between the first element and the second element for reducing a common-mode current between the first element and the second element.

15. The test apparatus used to measure common-mode capacitance according to claim 11 wherein both the transformer primary winding and the transformer secondary winding are disposed in a flyback converter.

16. A test apparatus used to measure common-mode capacitance between a first element and a second element being isolated from the first element, comprising:
- a signal generating device connected to the first element and having an internal signal source connected in series with a first internal impedance for sending a signal to the first element; and
- a signal receiving device directly connected between the second element and the first element and having a second internal impedance for measuring a signal response between the first element and the second element, thereby calculating the common-mode capacitance between the first element and the second element based on the signal response;
- wherein the first element includes a plurality of transformer primary windings and the second element includes a plurality of transformer secondary windings;
- wherein quiet points of the transformer primary windings are connected with each other to a first common node and quiet points of the transformer secondary windings are connected with each other to a second common node, and wherein the signal generating device is connected between a hot-voltage point of a main winding of the transformer primary windings and the first common node of the transformer primary winding and the signal receiving device is connected between the second common node of the transformer secondary windings and the first common node of the transformer primary windings.

17. The test apparatus used to measure common-mode capacitance according to claim 16 wherein the signal receiving device includes a spectrum analyzer.

18. The test apparatus used to measure common-mode capacitance according to claim 16 wherein the signal generating device and the signal receiving device are implemented in an EMI receiver or a network analyzer.

19. The test apparatus used to measure common-mode capacitance according to claim 16 further comprising a shielding layer connected to the first element and disposed between the first element and the second element for reducing a common-mode current between the first element and the second element.

20. The test apparatus used to measure common-mode capacitance according to claim 16 wherein both the transformer primary winding and the transformer secondary winding are disposed in a flyback converter.

* * * * *